(12) United States Patent
Tripathi et al.

(10) Patent No.: US 11,742,813 B2
(45) Date of Patent: Aug. 29, 2023

(54) PIECEWISE LINEAR GAIN AMPLIFIER

(71) Applicant: Omni Design Technologies Inc., Milpitas, CA (US)

(72) Inventors: Vaibhav Tripathi, Santa Clara, CA (US); Vikas Singh, Newark, CA (US)

(73) Assignee: Omni Design Technologies, Inc., Milpitas, CA (US)

( * ) Notice: Subject to any disclaimer, the term of this patent is extended or adjusted under 35 U.S.C. 154(b) by 115 days.

(21) Appl. No.: 17/444,209

(22) Filed: Aug. 2, 2021

(65) Prior Publication Data
US 2022/0038068 A1 Feb. 3, 2022

Related U.S. Application Data

(60) Provisional application No. 63/059,615, filed on Jul. 31, 2020.

(51) Int. Cl.
*H03F 3/45* (2006.01)
*H03G 1/00* (2006.01)
*H03F 1/02* (2006.01)

(52) U.S. Cl.
CPC ....... *H03F 3/45273* (2013.01); *H03F 1/0233* (2013.01); *H03G 1/0029* (2013.01)

(58) Field of Classification Search
CPC ............... H03F 3/45273; H03F 1/0233; H03F 2203/45392; H03F 3/211; H03F 3/45183; H03G 7/06; H03G 1/0029
USPC .................................................. 330/253, 254
See application file for complete search history.

(56) References Cited

U.S. PATENT DOCUMENTS

2003/0174023 A1\* 9/2003 Miyasita ............. H03F 3/45085
330/254

\* cited by examiner

*Primary Examiner* — Hafizur Rahman
*Assistant Examiner* — Khiem D Nguyen
(74) *Attorney, Agent, or Firm* — Intrinsic Law Corp.

(57) ABSTRACT

A piecewise linear gain amplifier circuit includes a differential preamplifier and a plurality of transconductors. The differential preamplifier is electrically coupled to a differential input having an input voltage. The transconductors are electrically coupled in parallel with each other. Each transconductor includes a respective differential input that is electrically coupled to a differential output of the differential preamplifier. In addition, each transconductor includes a respective differential output that is electrically coupled to a common differential PWL output. Each transconductor has a different linear input range. An optional attenuation circuit can be electrically coupled in parallel to the differential preamplifier. The differential output of the attenuation circuit can be electrically coupled to a differential input of another transconductor, and that transconductor can have a differential output that is electrically coupled to the common differential PWL output.

18 Claims, 9 Drawing Sheets

PIECEWISE LINEAR GAIN AMPLIFIER

CROSS-REFERENCE TO RELATED APPLICATIONS

This application claims priority to U.S. Provisional Application No. 63/059,615, titled "Piecewise Linear Gain CMOS Amplifier," filed on Jul. 31, 2020, which is hereby incorporated by reference.

TECHNICAL FIELD

This application relates generally to solid-state circuit amplifiers.

BACKGROUND

Voltage amplifiers are used in a variety of applications including analog-to-digital converters. One type of amplifier used to achieve a wide dynamic range is a log amplifier which has a gain that is proportional to the natural log of the input voltage. One problem with log amplifiers is that the output-input voltage transfer characteristic (essentially its gain and gain behavior) varies significantly with environment factors such as process and temperature. Furthermore, at high input voltages, when the gain saturates, the corresponding output voltage also depends on process and temperature.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a piecewise linear (PWL) gain amplifier circuit comprising: a differential preamplifier electrically coupled to a differential input, the differential input having an input voltage across the differential input; an attenuation circuit electrically coupled to the differential input, the attenuation circuit in parallel electrically with the differential preamplifier; and a plurality of transconductors, each transconductor having a respective differential output that is electrically coupled to a common differential PWL output. The plurality of transconductors comprises: a first transconductor having a differential input that is electrically coupled to a differential output of the differential preamplifier, the first transconductor having a first linear input range; a second transconductor having a differential input that is electrically coupled to the differential output of the differential preamplifier, the second transconductor having a second linear input range, the first and second transconductors in parallel electrically with each other; and a third transconductor having a differential input that is electrically coupled to a differential output of the attenuation circuit, the third transconductor having a third linear input range. The first linear input range is less than the second linear input range, and the second linear input range is less than the third linear input range.

In one or more embodiments, each transconductor comprises a differential transconductor. In one or more embodiments, each differential transconductor comprises: a first transistor having a gate terminal, a source terminal, and a drain terminal, the gate terminal of the first transistor electrically coupled to a first line of the differential output of the differential preamplifier; a first degeneration resistor electrically coupled to the source terminal of the first transistor; a second transistor having a gate terminal, a source terminal, and a drain terminal, the gate terminal of the second transistor electrically coupled to a second line of the differential output of the differential preamplifier; and a second degeneration resistor electrically coupled to the source terminal of the second transistor.

In one or more embodiments, the first and second transistors of each differential transconductor comprise NMOS transistors. In one or more embodiments, for each differential transconductor: the drain terminal of the first transistor is electrically coupled to a first line of the respective differential output of a respective transconductor, and the drain terminal of the second transistor is electrically coupled to a second line of the respective differential output of the respective transconductor. In one or more embodiments, a first load resistor is electrically coupled to a first line of the common differential PWL output, and a second load resistor is electrically coupled to a second line of the common differential PWL output. In one or more embodiments, the first and second lines of the common differential PWL output are electrically coupled to first and second input terminals, respectively, of an operational amplifier, the operational amplifier and the first and second load resistors forming a transimpedance amplifier. In one or more embodiments, the operational amplifier comprises first and second output terminals; a first feedback line is electrically coupled to the first input terminal, the first output terminal, and the first load resistor; and a second feedback line electrically is coupled to the second input terminal, the second output terminal, and the second load resistor.

In one or more embodiments, the differential preamplifier comprises: a first preamplifier transistor having a gate terminal, a source terminal, and a drain terminal, the gate terminal of the first preamplifier transistor electrically coupled to a first line of the differential input; a first preamplifier degeneration resistor electrically coupled to the source terminal of the first preamplifier transistor; a second preamplifier transistor having a gate terminal, a source terminal, and a drain terminal, the gate terminal of the second preamplifier transistor electrically coupled to a second line of the differential input; a second preamplifier degeneration resistor electrically coupled to the source terminal of the second preamplifier transistor; a first preamplifier load resistor electrically coupled to the drain terminal of the first preamplifier transistor; and a second preamplifier load resistor electrically coupled to the drain terminal of the second preamplifier transistor.

In one or more embodiments, the first and second preamplifier transistors comprise NMOS transistors. In one or more embodiments, each differential transconductor comprises: a first transistor having a gate terminal, a source terminal, and a drain terminal, the gate terminal of the first transistor electrically coupled to a first line of the differential output of the differential preamplifier; a first degeneration resistor electrically coupled to the source terminal of the first transistor; a second transistor having a gate terminal, a source terminal, and a drain terminal, the gate terminal of the second transistor electrically coupled to a second line of the differential output of the differential preamplifier; and a second degeneration resistor electrically coupled to the source terminal of the second transistor.

In one or more embodiments, a first transconductor bias current flows through the first or second degeneration resistor of the first differential transconductor, the first and second degeneration resistors of the first differential transconductor having a first degeneration resistance, a second transconductor bias current flows through the first or second degeneration resistor of the second differential transconductor, the first and second degeneration resistors of the second differential transconductor having a second degeneration resistance, and a preamplifier bias current flows through the first or second preamplifier degeneration resistor, the first and second degeneration resistors of the differential preamplifier having a preamplifier degeneration resistance. In one or more embodiments, the preamplifier bias current ($I_{PRE}$), the first transconductor bias current ($I_{B1}$), the second transconductor bias current ($I_{B2}$), the preamplifier degeneration resistance ($R_{PRE}$), the first degeneration resistance ($R_{S1}$), and the second degeneration resistance ($R_{S2}$), have the following relationship:

$$\frac{I_{PRE} \times R_{PRE}}{G_{PRE}} > I_{B2} \times R_{S2} > I_{B1} \times R_{S1}$$

where $G_{PRE}$ is a gain of the differential preamplifier.

In one or more embodiments, a first load resistor is electrically coupled to a first line of the common differential PWL output, a second load resistor is electrically coupled to a second line of the common differential PWL output, the first and second load resistors have a load resistance ($R_{TIA}$), a first transition voltage ($V_{OX}$) corresponds to an outer limit of the first linear input range of the first transconductor, a second transition voltage ($V_{OY}$) corresponds to an outer limit of the second linear input range of the second transconductor, and the first transition voltage ($V_{OX}$), the second transition voltage ($V_{OY}$), the first transconductor bias current ($I_{B1}$), the second transconductor bias current ($I_{B2}$), and the load resistance ($R_{TIA}$) have the following relationship: $|V_{OX}|=2I_{B1} \times R_{TIA}$, and $|V_{OY}|=2I_{B2} \times R_{TIA}$. In one or more embodiments, the first and second transconductor bias currents ($I_{B1}$, $I_{B2}$) are proportional to $1/R_{TIA}$, such that the first and second transition voltages ($V_{OX}$, $V_{OY}$) are substantially constant over a variation in a semiconductor manufacturing process, a temperature of the PWL gain amplifier circuit, and/or a supply voltage at the common differential PWL output.

In one or more embodiments, a first load resistor is electrically coupled to a first line of the common differential PWL output, a second load resistor is electrically coupled to a second line of the common differential PWL output, the first and second load resistors have a load resistance ($R_{TIA}$), a first transition voltage ($V_{OX}$) corresponds to an outer limit of the first linear input range of the first transconductor, a second transition voltage ($V_{OY}$) corresponds to an outer limit of the second linear input range of the second transconductor, and the first transition voltage ($V_{OX}$), the second transition voltage ($V_{OY}$), the first transconductor bias current ($I_{B1}$), the second transconductor bias current ($I_{B2}$), and the load resistance ($R_{TIA}$) have the following relationship: $|V_{OX}|=2I_{B1} \times R_{TIA}$, and $|V_{OY}|=2I_{B2} \times R_{TIA}$. In one or more embodiments, the first and second transconductor bias currents ($I_{B1}$, $I_{B2}$) are proportional to $1/R_{TIA}$, such that the first and second transition voltages ($V_{OX}$, $V_{OY}$) are substantially constant over a variation in a process, a temperature of the PWL gain amplifier circuit, and/or a supply voltage at the common differential PWL output.

In one or more embodiments, when an absolute value of the input voltage is less than a first transition voltage, the differential preamplifier and each transconductor contribute to a voltage gain of the input voltage, and the first transition voltage corresponds to an outer limit of the first linear input range of the first transconductor. In one or more embodiments, when the absolute value of the input voltage is between the first transition voltage and a second transition voltage, only the differential preamplifier and the second and third transconductors contribute to the voltage gain of the input voltage, the second transition voltage is higher than the first transition voltage, and the second transition voltage corresponds to an outer limit of the second linear input range of the second transconductor. In one or more embodiments, when the absolute value of the input voltage is greater than the second transition voltage, only the differential preamplifier and the third transconductor contribute to the voltage gain of the input voltage.

Another aspect of the invention is directed to a piecewise linear (PWL) gain amplifier circuit comprising: a differential preamplifier electrically coupled to a differential input, the differential input having an input voltage across the differential input; and a plurality of transconductors electrically coupled in parallel with each other, each transconductor having: a respective differential input that is electrically coupled to a differential output of the differential preamplifier, and a respective differential output that is electrically coupled to a common differential PWL output, wherein each transconductor has a different linear input range.

In one or more embodiments, the plurality of transconductors comprises a first transconductor having a first linear output range and a second transconductor having a second linear output range, and the first linear input range is less than the second linear output range. In one or more embodiments, the plurality of transconductors further comprises a third transconductor having a third linear output range, and the second linear output range is less than the third linear output range. In one or more embodiments, each transconductor comprises a differential transconductor.

BRIEF DESCRIPTION OF THE DRAWINGS

For a fuller understanding of the nature and advantages of the concepts disclosed herein, reference is made to the detailed description of preferred embodiments and the accompanying drawings.

DETAILED DESCRIPTION

A piecewise linear (PWL) gain amplifier includes a differential preamplifier and a plurality of transconductors. Each transconductor has a respective linear input range (LIR). The differential preamplifier (PREAMP) has a differential input having an input voltage $V_{in}$ across the differential input. The differential output of the PREAMP is electrically coupled to the transconductors, which are electrically coupled in parallel with each other. The LIR of the first transconductor is less than that of the second transconductor; the LIR of the second transconductor is less than that of the third transconductor, and so on.

A first transition voltage corresponds to the outer limit of the LIR of the first transconductor. A second transition voltage corresponds to the outer limit of the LIR of the second transconductor. When the absolute value of the input voltage is below the first transition voltage (e.g., between the first transition voltage and 0 V), the PREAMP and each transductor contribute to the voltage gain of the input voltage $V_{in}$. When the absolute value of the input voltage is between the first transition voltage and the second transition voltage, only the PREAMP, the second transconductor, and the third transconductor contribute to the voltage gain of the input voltage $V_{in}$. When the absolute value of the input voltage is higher than the second transition voltage, only the PREAMP and the third transductor contribute to the voltage gain of the input voltage $V_{in}$.

An optional attenuation circuit can be electrically coupled in parallel with the PREAMP. The attenuation circuit has a differential input having an input voltage $V_{in}$ across the differential input. The differential output of the attenuation circuit is electrically coupled to another transconductor (e.g., a fourth transconductor) that has a higher LIR than the transconductors that are electrically coupled to the PREAMP. The optional attenuation circuit and transconductor can increase the dynamic range of the PWL gain amplifier.

Figure 1:
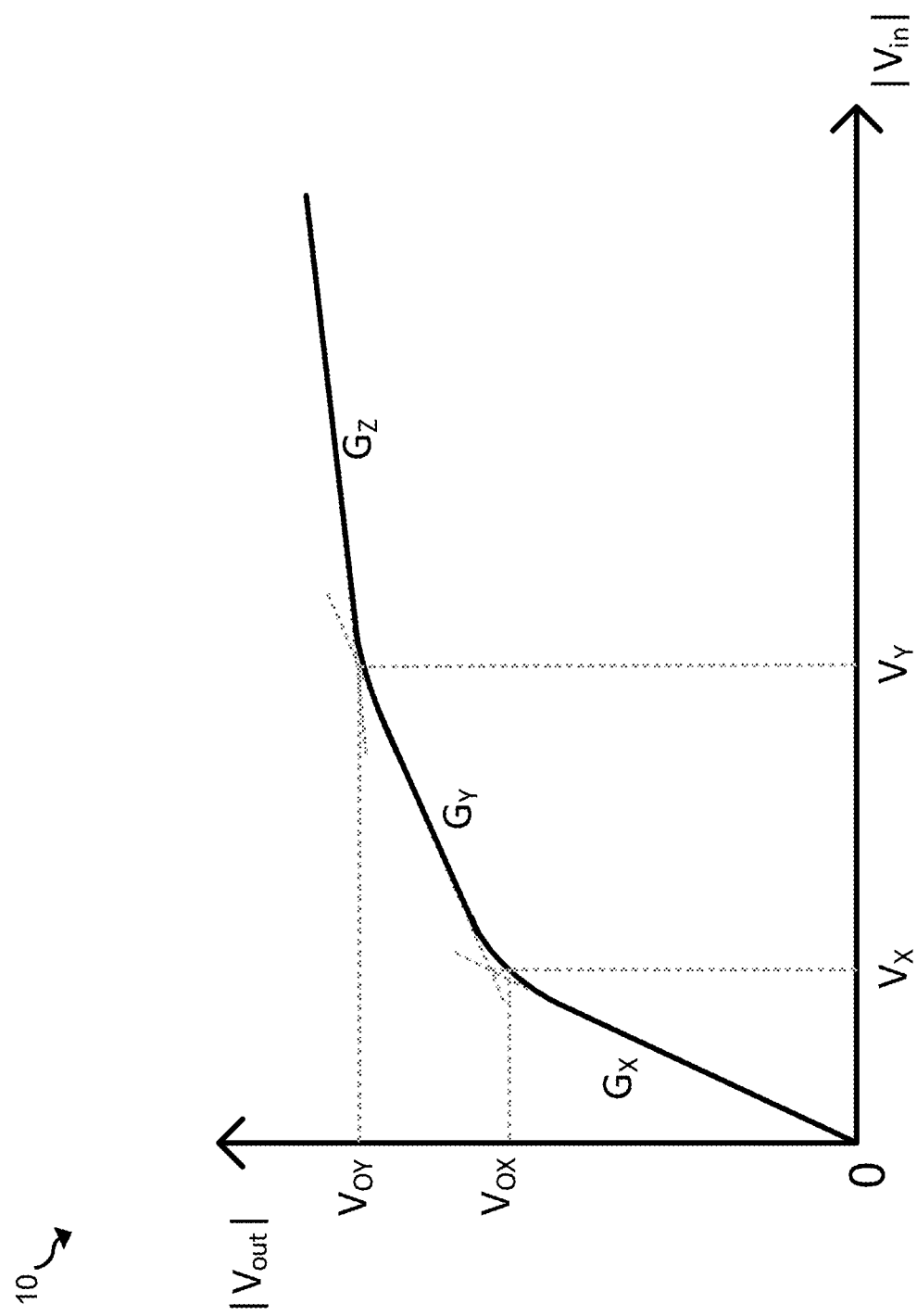
FIG. 1 is an example graph of a simplified 3-segment voltage transfer function of a PWL gain amplifier according to an embodiment.

FIG. 1 is an example graph 10 of a simplified 3-segment voltage transfer function of a PWL gain amplifier according to an embodiment. The graph 10 illustrates three linear gain regions labeled as $G_X$, $G_Y$, and $G_Z$. These regions ($G_X$, $G_Y$, and $G_Z$) are the incremental voltage gains between $|V_{in}|$ and $|V_{out}|$ for the PWL amplifier where $G_X > G_Y > G_Z$. When $|V_{in}| < V_X$, the amplifier exhibits a gain of $G_X$, followed by a gain of $G_Y$ for $V_X < |V_{in}| < V_Y$, and then a voltage gain of $G_Z$ for $|V_{in}| > V_Y$ (where $V_X < V_Y$). $V_X$ and $V_Y$ are the first and second transition voltages, respectively, in graph 10.

Figure 2:
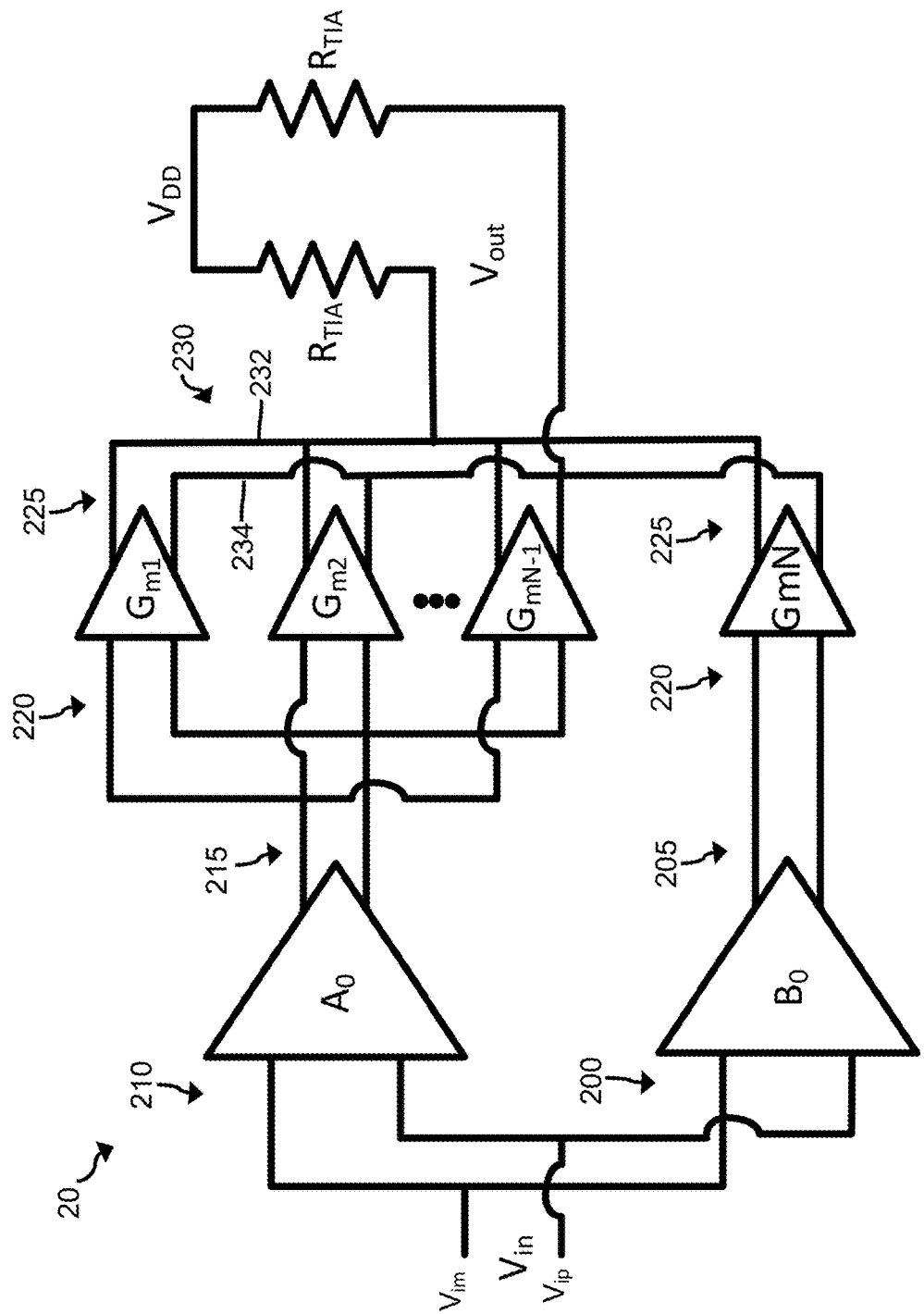
FIG. 2 is a circuit diagram of a PWL gain amplifier circuit according to an embodiment.

FIG. 2 is a circuit diagram of a PWL gain amplifier circuit 20 according to an embodiment. The gain amplifier circuit 20 is configured to implement an N-segment PWL voltage transfer function have N linear gain regions. In some embodiments, the PWL gain amplifier circuit 20 can implement the 3-segment PWL linear voltage transfer function illustrated in graph 10. N can be a positive integer that is greater than or equal to 2 (e.g., 2, 3, 4, or another positive integer greater than or equal to 2).

The PWL gain amplifier circuit 20 includes a differential preamplifier $A_0$, an attenuation circuit $B_0$, and a plurality of transconductors $G_{m1}$, $G_{m1}$, . . . $G_{mN}$ (in general, transconductor $G_m$). The differential preamplifier $A_0$ and attenuation circuit $B_0$ are electrically coupled in parallel to each other and have a respective differential input 200, 210 that has a differential input voltage $V_{in}$ (e.g., a positive input voltage $V_{ip}$ and a negative input voltage $V_{in}$ on each line of the respective differential input 200, 210).

Each transconductor $G_m$ has a differential input 220 and a differential output 225. The transconductors $G_{m1}$, $G_{m2}$, . . . $G_{mN-1}$ are electrically coupled in parallel with each other. The differential inputs 220 of transconductors $G_{m1}$, $G_{m2}$, . . . $G_{mN-1}$ are electrically coupled to a differential output 215 of the differential preamplifier $A_0$. The differential input 220 of transconductor $G_{mN}$ is electrically coupled to a differential output 205 of the attenuation circuit $B_0$. In addition, the differential input 220 of transconductor $G_{mN}$ is electrically isolated from the differential inputs 220 of the other transconductors (i.e., transconductors $G_{m1}$, $G_{m2}$, . . . $G_{mN-1}$).

The differential outputs 225 of the transconductor $G_m$ are electrically coupled to each other at a common differential PWL output 230 having a differential output voltage $V_{out}$. Each side 232, 234 of the common differential PWL output 230 is electrically coupled to a respective load resistor $R_{TIA}$ to amply the differential output voltage $V_{out}$ to a supply voltage $V_{DD}$ at supply line 240.

Each transconductor $G_m$ has an LIR over which the output current is a linear function (or approximately a linear function) of the differential input voltage at the differential input of the transconductor $G_m$. $G_{m1}$ has a first LIR, $G_{m2}$ has a second LIR, $G_{m3}$ has a third LIR, and so on. $G_{mN-1}$ has an (N−1) LIR. The LIR of $G_{m1}$<LIR of $G_{m2}$<LIR of $G_{m3}$< . . . <LIR of $G_{mN-1}$. The attenuation circuit $B_0$ decreases the magnitude of the input voltage $V_{in}$, which contributes to $G_{mN}$ having the largest LIR, thus increasing the dynamic range of the PWL gain amplifier circuit 20. As such, each transconductor $G_m$ has a different LIR with $G_{mN}$ having the largest LIR.

The transductors $G_m$ can comprise differential pair transconductors or other transconductors. Each transconductor $G_m$ can be the same type or different type of transconductor than the other transductors $G_m$.

In operation, when the absolute value of the input voltage is lower than a first transition voltage (e.g., between the first transition voltage and 0), the differential preamplifier $A_0$ and each transductor $G_m$ contribute to the voltage gain of the input voltage $V_{in}$. The first transition voltage corresponds to the outer limit of the LIR of $G_{m1}$. When the absolute value of the input voltage is between the first transition voltage and a second transition voltage, the differential preamplifier $A_0$ and all transductors $G_m$ except $G_{m1}$ contribute to the voltage gain of the input voltage $V_{in}$. Transconductor $G_{m1}$ does not contribute to the voltage gain of the input voltage $V_{in}$ when the absolute value of the input voltage $V_{in}$ is greater than the first transition voltage because transconductor $G_{m1}$ is saturated.

The second transition voltage corresponds to the outer limit of the LIR of $G_{m2}$. When the absolute value of the input voltage is between the second transition voltage and a third transition voltage, the differential preamplifier $A_0$ and all transductors $G_m$ except $G_{m1}$ and $G_{m2}$ contribute to the voltage gain of the input voltage $V_{in}$. Transconductors $G_{m1}$ and $G_{m2}$ do not contribute to the voltage gain of the input voltage $V_{in}$ when the absolute value of the input voltage $V_{in}$ is greater than the second transition voltage because transconductors $G_{m1}$ and $G_{m2}$ are saturated.

In general, the $M^{th}$ transition voltage corresponds to the outer limit of the LIR of $G_{mM}$. M is a positive integer that is greater than or equal to 1 and less than or equal to N. When the absolute value of the input voltage is between the $(M-1)^{th}$ transition voltage and the $M^{th}$ transition voltage, the differential preamplifier $A_0$ and all transductors $G_m$ except transductor(s) $G_{m1} \ldots G_{mM}$ contribute to the voltage gain of the input voltage $V_{in}$. In other words, the differential preamplifier $A_0$ and transconductors $G_{mM+1} \ldots G_{mN}$ contribute to the voltage gain of the input voltage $V_{in}$ when the absolute value of the input voltage is between the $(M-1)^{th}$ transition voltage and the $M^{th}$ transition voltage. Transconductors $G_{m1} \ldots G_{mM}$ do not contribute to the voltage gain of the input voltage $V_{in}$ when the absolute value of the input voltage is between the $(M-1)^{th}$ transition voltage and the $M^{th}$ transition voltage.

When the absolute value of the input voltage is greater than the $(N-1)^{th}$ transition voltage, only the differential preamplifier $A_0$ and transductor $G_{mN}$ contribute to the voltage gain of the input voltage $V_{in}$. Transconductors $G_{m1} \ldots G_{mN-1}$ do not contribute to the voltage gain of the input voltage $V_{in}$ when the absolute value of the input voltage is between the $(M-1)^{th}$ transition voltage and the $M^{th}$ transition voltage.

Figure 3:
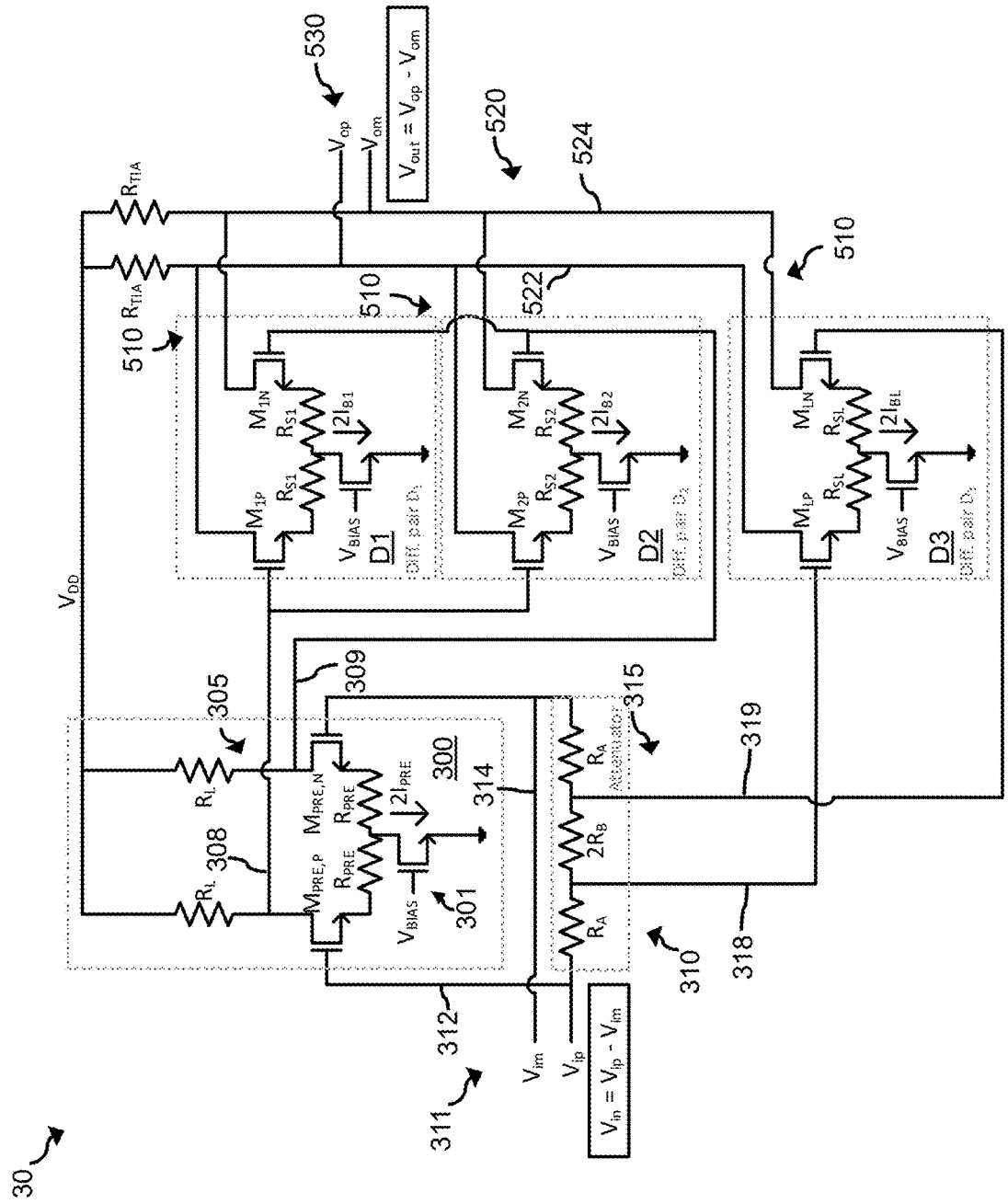
FIG. 3 is a circuit diagram of a PWL gain amplifier circuit according to an embodiment.

FIG. 3 is a circuit diagram of a PWL gain amplifier circuit 30 according to an embodiment. PLW amplifier circuit 30 includes a differential preamplifier 300, an attenuation circuit 310 and three differential-pair transconductors D1, D2, and D3. PWL gain amplifier circuit 30 can be the same as PWL gain amplifier circuit 20 when PWL gain amplifier circuit 20 includes three transductors $G_m$ (i.e., transconductors $G_{m1}$, $G_{m2}$, and $G_{m3}$, where N=3).

Figure 4:
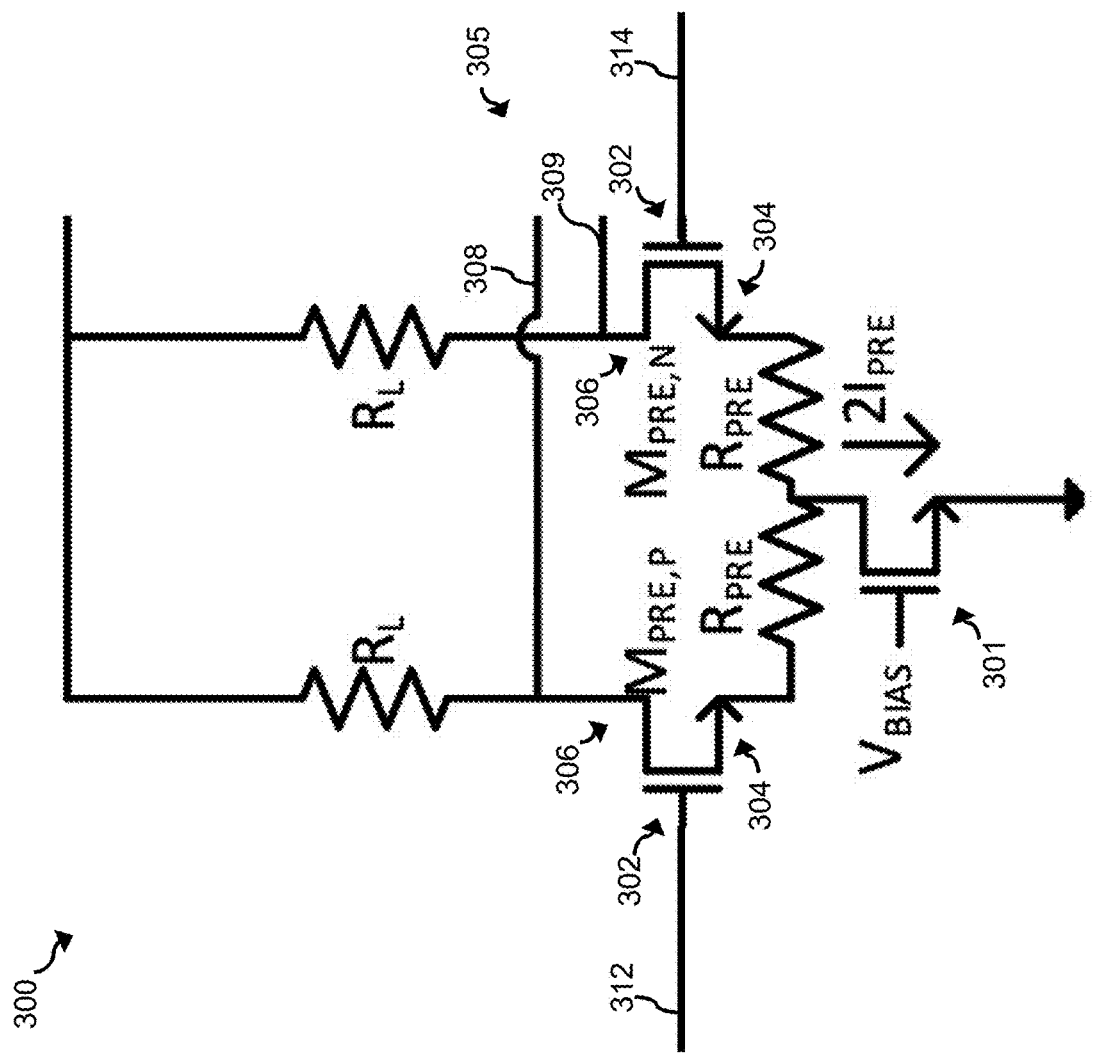
FIG. 4 is an enlarged view of the differential preamplifier illustrated in FIG. 3.

The differential preamplifier 300 includes first and second preamplifier transistors $M_{PRE,P}$, $M_{PRE,N}$. The preamplifier transistors $M_{PRE,P}$, $M_{PRE,N}$ are illustrated as NMOS transistors. In other embodiments, both $M_{PRE,P}$, $M_{PRE,N}$ can be PMOS transistors. In a preferred embodiment, the preamplifier transistors $M_{PRE,P}$, $M_{PRE,N}$ are the same type of transistor (e.g., both NMOS or both PMOS). An enlarged view of differential preamplifier 300 is illustrated in FIG. 4. The gate terminal 302 of each preamplifier transistor MOP, MON is electrically coupled to a respective line of differential input 311. Specifically, a positive input line 312 is electrically coupled to the gate terminal 302 of preamplifier transistor $M_{PRE,P}$, and a negative input line 314 is electrically coupled to the gate terminal 302 of preamplifier transistor $M_{PRE,N}$. A respective degeneration resistor $R_{PRE}$ is electrically coupled to a source terminal 304 of each preamplifier transistor $M_{PRE,P}$, $M_{PRE,N}$. A respective preamplifier load resistor $R_L$ is electrically coupled to a drain terminal 306 of each preamplifier transistor $M_{PRE,P}$, $M_{PRE,N}$. The degeneration resistors $R_{PRE}$ preferably have the same resistance value. In addition, the preamplifier load resistors $R_L$ preferably have the same resistance value.

A bias current $I_{PRE}$ flows through each degeneration resistor $R_{PRE}$ and twice the bias current $I_{PRE}$ (i.e., $2I_{PRE}$) flows through the bias transistor 301 to ground. The bias transistor 301 can function as a bias current source. In another embodiment, the bias transistor 301 can be cascoded. The bias transistor 301 is preferably the same type of transistor (e.g., NMOS or PMOS) as the preamplifier transistors $M_{PRE,P}$, $M_{PRE,N}$. The differential preamplifier 300 has a differential output 305 represented as positive output line 308 and negative output line 309. The gain ($G_{PRE}$) of the differential amplifier 300 is approximately equal (e.g., +/−10%) to $R_L/R_{PRE}$. Differential preamplifier 300 can be the same as or different than differential preamplifier $A_0$.

Returning to FIG. 3, the attenuation circuit 310 includes a first resistor $R_A$ that is electrically coupled in series with a respective input line 312, 314 and a second resistor RB that is electrically coupled in parallel with first resistors $R_A$. As such, the attenuation circuit 310 attenuates the input voltage $V_{in}$ by a factor of $$\frac{R_B}{R_B + R_A}.$$

The attenuation circuit 310 can have other configurations, and thus provide other attenuation factors in other embodiments. The attenuation circuit 310 has a differential output 315 represented as positive output line 318 and negative output line 319. The attenuation circuit 310 can be the same as or different than attenuation circuit $B_0$.

Each differential-pair transconductor D1, D2, and D3 (in general, differential-pair transconductor DN) includes first and second preamplifier transistors $M_P$, $M_N$ and first and second degeneration resistors $R_S$. For example, differential-pair transconductor D3 includes first and second differential-amplifier transistors $M_{LP}$, $M_{LN}$ and first and second degeneration resistors $R_{SL}$. The degeneration resistors $R_{SL}$ preferably have the same resistance value. Differential-pair transconductor D1 includes first and second differential-amplifier transistors $M_{1P}$, $M_{1N}$ and first and second degeneration resistors $R_{S1}$. The degeneration resistors $R_{S1}$ preferably have the same resistance value. Differential-pair transconductor D2 includes first and second differential-amplifier transistors $M_{2P}$, $M_{2N}$ and first and second degeneration resistors $R_{S2}$. The degeneration resistors $R_{S2}$ preferably have the same resistance value. The differential-pair transconductors D1, D2, and D3 can be the same as transconductors $G_{m1}$, $G_{m2}$, and $G_{m3}$, respectively, when PWL gain amplifier circuit 20 includes only three transductors $G_m$.

Figure 5:
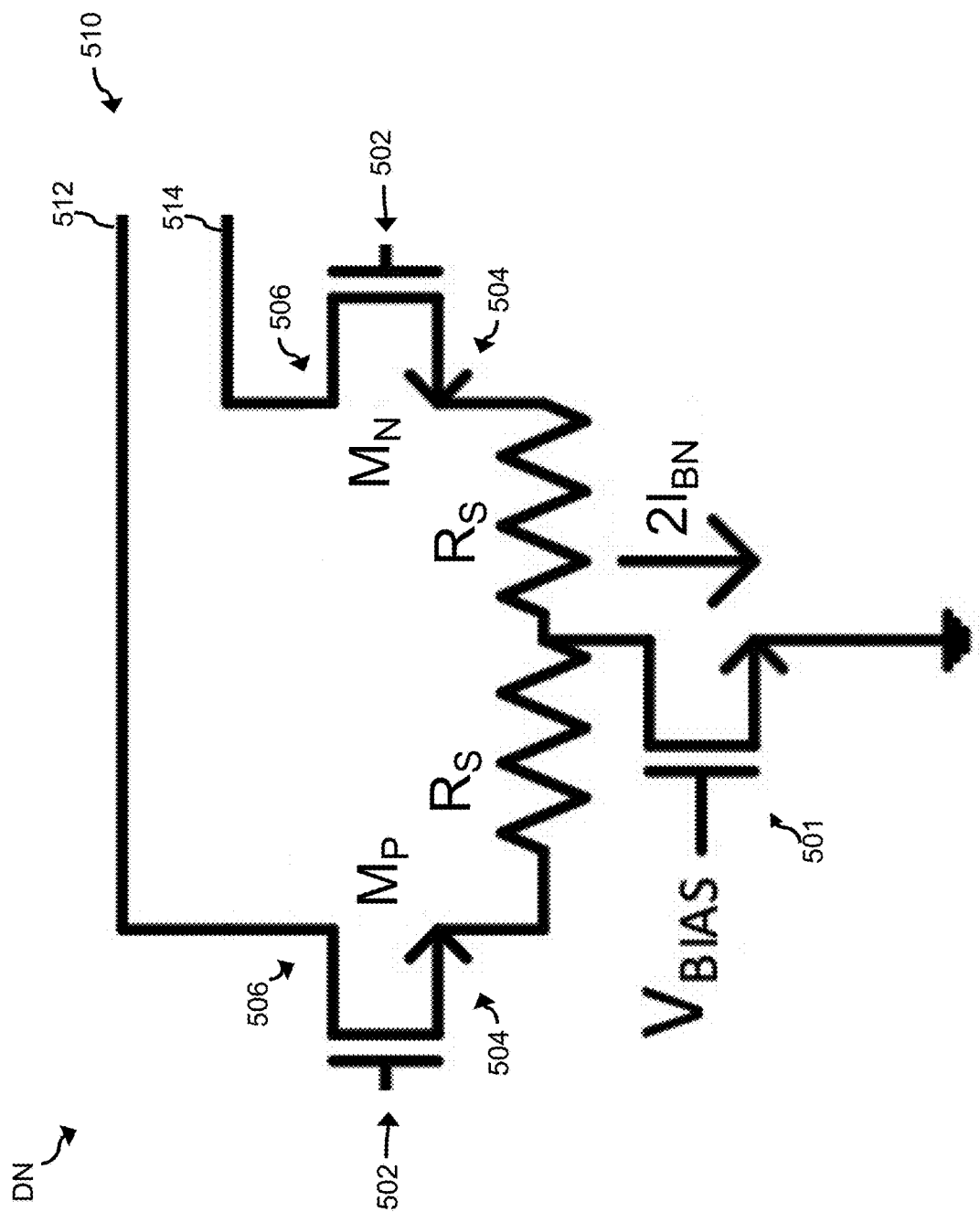
FIG. 5 is an enlarged view of an example differential-pair transconductor illustrated in FIG. 3.

FIG. 5 is an enlarged view of an example differential-pair transconductor DN, which can correspond to differential-pair transconductor(s) D1, D2, and/or D3 in FIG. 3. Differential-pair transconductor DN includes differential-pair transistors $M_P$, $M_N$, and degeneration resistors $R_S$.

The differential-pair transistor $M_P$, $M_N$ are illustrated as NMOS transistors. In other embodiments, one or both differential-amplifier transistor(s) $M_P$, $M_N$ can be PMOS transistors. In a preferred embodiment, differential-pair transistor(s) $M_P$, $M_N$ are the same type of transistor (e.g., NMOS or PMOS). Each differential-pair transistor $M_P$, $M_N$ includes a gate terminal 502, a source terminal 504, and a drain terminal 506. The gate terminal 502 of each differential-amplifier transistor $M_P$, $M_N$ is electrically coupled to a respective input line. For D1 and D2, the gate terminals 502 are electrically coupled to the output lines 308, 309 (e.g., the differential output 305) of the differential preamplifier 300. For example, the gate terminal 502 of differential-pair transistor $M_P$ in D1 and D2 is electrically coupled to positive output line 308, which is electrically coupled to the drain terminal 306 of preamplifier transistor $M_{PRE,P}$. In addition, the gate terminal 502 of differential-pair transistor $M_N$ in D1 and D2 is electrically coupled to negative output line 309, which is electrically coupled to the drain terminal 306 of preamplifier transistor $M_{PRE,N}$. Thus, D1 and D2 each has a differential input that is electrically coupled to the differential output 305 of the differential preamplifier 300.

For D3, the gate terminals 502 are electrically coupled to the output lines 318, 319 (e.g., the differential output 315) of the attenuation circuit 310. For example, the gate terminal 502 of differential-pair transistor $M_P$ in D3 is electrically coupled to the positive output line 318 of attenuation circuit 310. In addition, the gate terminal 502 of differential-pair transistor $M_N$ in D3 is electrically coupled to the negative output line 319 of attenuation circuit 310. Thus, D3 has a differential input that is electrically coupled to the differential output 315 of the attenuation circuit 310.

A respective degeneration resistor $R_S$ is electrically coupled to the source terminal 504 of each differential-amplifier transistor $M_P$, $M_N$. For a given differential-pair transconductor, the degeneration resistors $R_S$ preferably have the same resistance value. The degeneration resistors $R_S$ of different differential-pair transconductors can have the same or different values. A bias current $I_{BN}$ flows through each degeneration resistor $R_S$ and twice the bias current $I_{BN}$ (i.e., $2I_{BN}$) flows through the bias transistor 501 to ground. The bias transistor 501 can function as a current source. In another embodiment, the bias transistor 501 can be cascoded. The bias transistor 501 is preferably the same type of transistor (e.g., NMOS or PMOS) as the differential-pair transistors $M_P$, $M_N$.

The drain terminal 506 of each differential-amplifier transistor $M_P$, $M_N$ is electrically coupled to a respective side of a differential output 510. For example, the drain terminal 506 of differential-amplifier transistor $M_P$ is electrically coupled to a common positive output line 512. In addition, the drain terminal 506 of differential-amplifier transistor $M_N$ is electrically coupled to a common negative output line 514. As illustrated in FIG. 3, each differential output 510 is electrically coupled to a common differential PWL output 520, which is electrically coupled to a differential PWL amplifier circuit output 530. The differential PWL amplifier circuit output 530 has a positive output voltage $V_{op}$ and a negative output voltage $V_{om}$ where the PWL output voltage $V_{out} = V_{op} - V_{om}$. The common differential PWL output 520 can be the same as common differential PWL output 230. For example, the common differential PWL output 520 includes first and second sides 522, 524 (e.g., positive and negative sides, respectively) that can the same as the first and second sides 322, 324 (e.g., positive and negative sides, respectively) of common differential PWL output 230.

In some embodiments, the preamplifier transistors $M_{PRE,P}$, $M_{PRE,N}$ and the differential-amplifier transistors $M_N$, $M_P$ can be sized to have approximately equal current densities (e.g., within +/−1-5% of each other). The bias currents and degeneration resistor values can be chosen and/or configured such that the following relationship applies:

$$I_{B1} \times R_{S1} < I_{B2} \times R_{S2} < \frac{I_{PRE} \times R_{PRE}}{G_{PRE}}$$

In this configuration, the input voltage required to completely steer the entire respective bias currents towards one leg of the differential pair will be smallest for D1 followed by D2 and then the PREAMP. This can be represented mathematically by Equations (1) and (2).

$$|V_{in}| > V_X = 2(I_{B1} \times R_{S1}/G_{PRE}) \Rightarrow I_{M_{1P}} = 2I_{B1}, I_{M_{1N}} = 0 \\ (V_{in} > V_X) \& I_{M_{1P}} = 0, I_{M_{1N}} = 2I_{B1}(V_{in} < -V_X)$$ (1)

$$|V_{in}| > V_Y = 2(I_{B2} \times R_{S2}/G_{PRE}) \Rightarrow I_{M_{2P}} = 2I_{B2}, I_{M_{2N}} = 0 \\ (V_{in} > V_Y) \& I_{M_{2P}} = 0, I_{M_{2N}} = 2I_{B2}(V_{in} < -V_Y)$$ (2)

The corresponding output voltages when input voltage $V_{in}$ equals $V_X$ and $V_Y$ (depicted above) are represented by Equations (3) and (4).

$$|V_{OX}| = 2I_{B1} \times R_{TIA}$$ (3)

$$|V_{OY}| = 2I_{B2} \times R_{TIA}$$ (4)

In addition to the PREAMP, D1, and D2, FIG. 3 depicts another differential pair, D3, realized by NMOS transistors $M_{LP}$ and $M_{LN}$. The input voltage to D3 is attenuated by $$\frac{R_B}{R_B + R_A},$$

which together with the degeneration resistor $R_{SL}$ ensures that the voltage required to steer the entire bias current towards one leg of D3 is significantly larger than $V_Y$ (see Equation (2)). Essentially, this realizes a near-constant gain for the entire input voltage range of the PWL amplifier and is represented by Equation (5).

$$G_Z \approx \frac{R_B}{(R_A + R_B)} \times \frac{R_{TIA}}{R_{SL}}$$ (5)

Using Equations (1)-(5), the PWL voltage transfer characteristics of graph 10 can now be described with respect to PWL gain amplifier circuit 30. When $0 < |V_{in}| < V_X$, the PREAMP, D1, D2, and D3 contribute to the total voltage gain, which can be characterized as $$G_X \approx \frac{R_L}{R_S} \times (G_{m1} + G_{m2}) \times R_{TIA} + G_Z,$$

where $G_{m1}$ and $G_{m2}$ are the total effective transconductances realized by D1 and D2, respectively, when $|V_{in}| = V_X$. Next, when $V_X < |V_{in}| < V_Y$, D1 is saturated and the PREAMP, D2, and D3 contribute to the total voltage gain, which can be characterized as $$G_Y \approx \frac{R_L}{R_S} \times G_{m2} \times R_{TIA} + G_Z.$$

Finally, when $|V_{in}| > V_Y$, the voltage gain is equal to $G_Z$ as depicted in Equation (5). As such, the LIR of D1<LIR of D2<LIR of D3.

It is noted that by changing the values of the resistors and bias currents, the gains GX, GY, and GZ as well as the breakpoints of the voltage transfer characteristic ($V_X$, $V_Y$, $V_{OX}$, $V_{OY}$) (e.g., the values of $V_X$, $V_Y$, $V_{OX}$, and/or $V_{OY}$) can be programmed and/or configured. Especially, if the bias currents $I_{B1}$ and $I_{B2}$ are made inversely proportional to the load resistor $R_{TIA}$, the output transition voltages $V_{OX}$ and $V_{OY}$ are substantially constant (e.g., within less than or equal to +/−1%) against variations in semiconductor manufacturing process, temperature (e.g., temperature of the PWL gain amplifier circuit 30), and/or supply voltage. For example, a semiconductor foundry manufactures integrated circuits at "typical" process conditions, in which case the NMOS and PMOS transistors (e.g., M) are manufactured with "typical" parameters (e.g., speed, etc.). The semiconductor foundry may shift (e.g., vary) the process overtime, which may result in relatively slower or relatively faster conditions.

Therefore, in operation, when the absolute value of the input voltage is lower than a first transition voltage $V_X$ (e.g., between 0 and $V_X$), the differential preamplifier 300 and each differential-pair transductor D1-D3 contribute to the voltage gain of the input voltage $V_{in}$. The first transition voltage corresponds to the outer limit of the LIR of differential-pair transductor D1. When the absolute value of the input voltage is between the first transition voltage $V_X$ and a second transition voltage $V_Y$, the differential preamplifier $A_0$ and differential-pair transductor D2 and attenuator together with D3 contribute to the voltage gain of the input voltage $V_{in}$. Differential-pair transductor D1 does not contribute to the voltage gain of the input voltage $V_{in}$ when the input voltage $V_{in}$ is greater than the first transition voltage $V_X$ because differential-pair transductor D1 is saturated. The second transition voltage $V_Y$ corresponds to the outer limit of the LIR of differential-pair transductor D2.

When the absolute value of the input voltage is greater than the second transition voltage $V_Y$, only the differential preamplifier 300 and the differential-pair transductor D3 contribute to the voltage gain of the input voltage $V_{in}$. Differential-pair transductors D1 and D2 do not contribute to the voltage gain of the input voltage $V_{in}$ when the input voltage $V_{in}$ is greater than the second transition voltage $V_Y$ because differential-pair transductor D1 and D2 are saturated.

Figure 6:
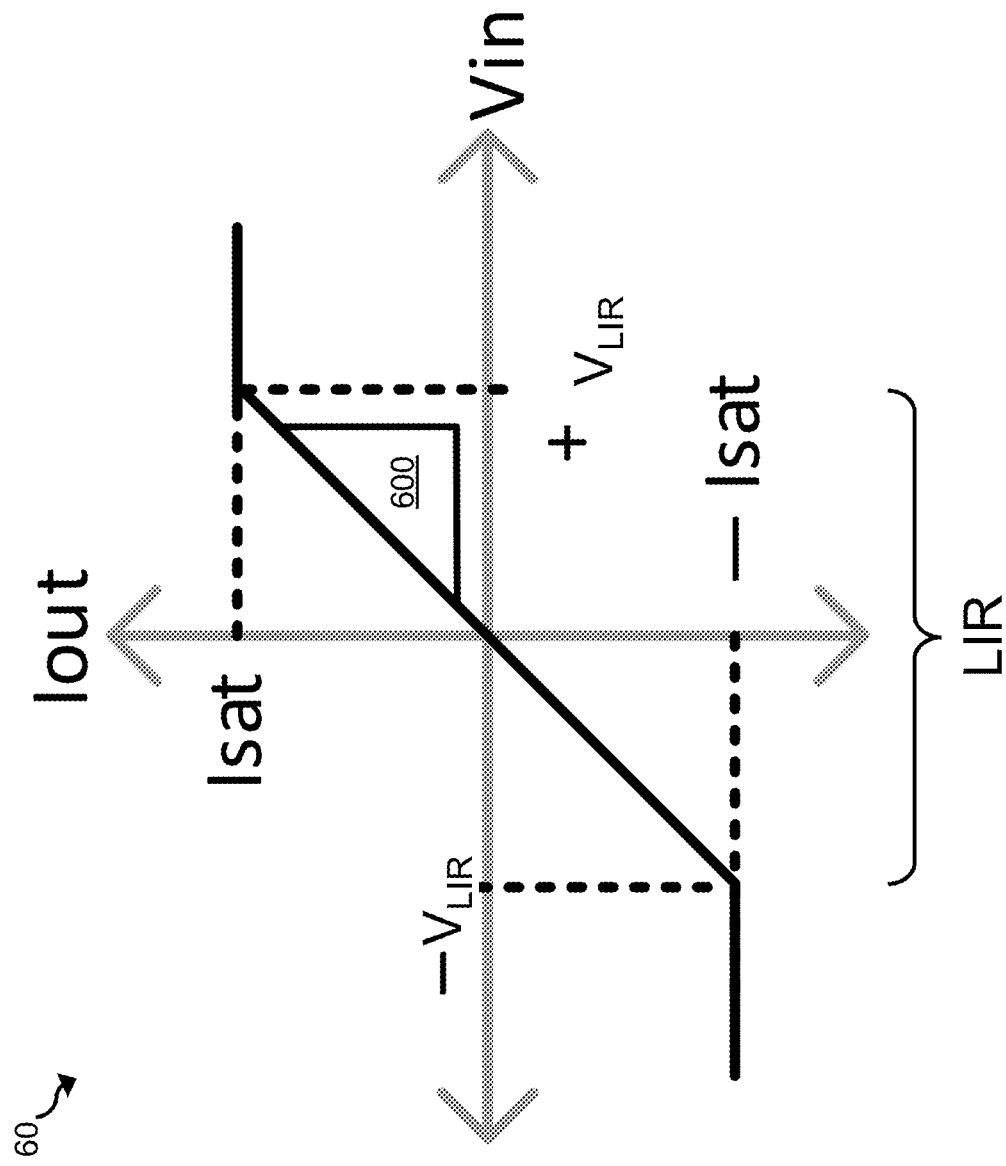
FIG. 6 is a graph of the linear input range of a transconductor according to an embodiment

FIG. 6 is a graph 60 of the LIR of a transconductor according to an embodiment. The LIR extends from a negative input voltage $-V_{LIR}$ to a positive input voltage $+V_{LIR}$. In the LIR, the output current $I_{out}$ varies linearly (or approximately linearly) with the input voltage $V_{in}$. The linear relationship between the input voltage $V_{in}$ and output current $I_{out}$ is the gain 600 of the transconductor. When the absolute value of the input voltage $V_{in}$ is greater than $V_{LIR}$, the transconductor is saturated and the gain is 0 (or approximately 0). Graph 60 can represent the LIR of any of the transconductors described herein including transconductors $G_m$ and differential-pair transconductors D1, D2, and D3, though the gain 600 of each transconductor may be different.

Figure 7:
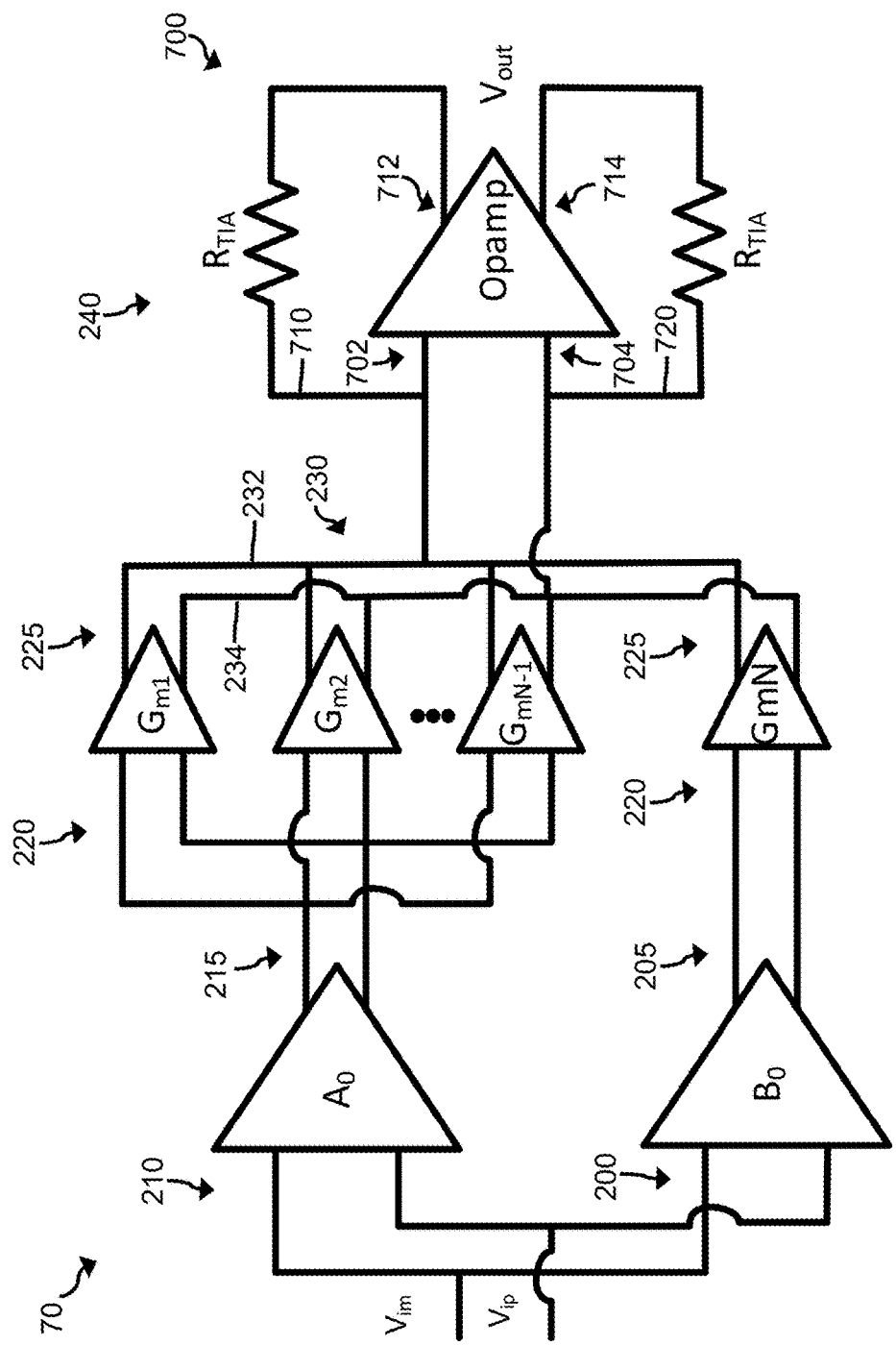
FIG. 7 is a circuit diagram of a PWL gain amplifier circuit according to an alternative embodiment.

FIG. 7 is a circuit diagram of a PWL gain amplifier circuit 70 according to an alternative embodiment. PWL gain amplifier circuit 70 is the same as PWL amplifier gain circuit 20 except that in PWL gain amplifier circuit 70 the common differential PWL output 230 is electrically coupled to an operational amplifier (Opamp) and load resistors $R_{TIA}$ are wrapped around the Opamp in respective feedback circuits to form a transimpedance amplifier 700. For example, the Opamp includes first and second input terminals 702, 704 and first and second output terminals 712, 714. A first feedback line 710 is electrically coupled to the first input terminal 702, the first output terminal 712, and the first load resistor $R_{TIA}$. A second feedback line 720 is electrically coupled to the second input terminal 704, the second output terminal 714, and the second load resistor $R_{TIA}$.

Figure 8:
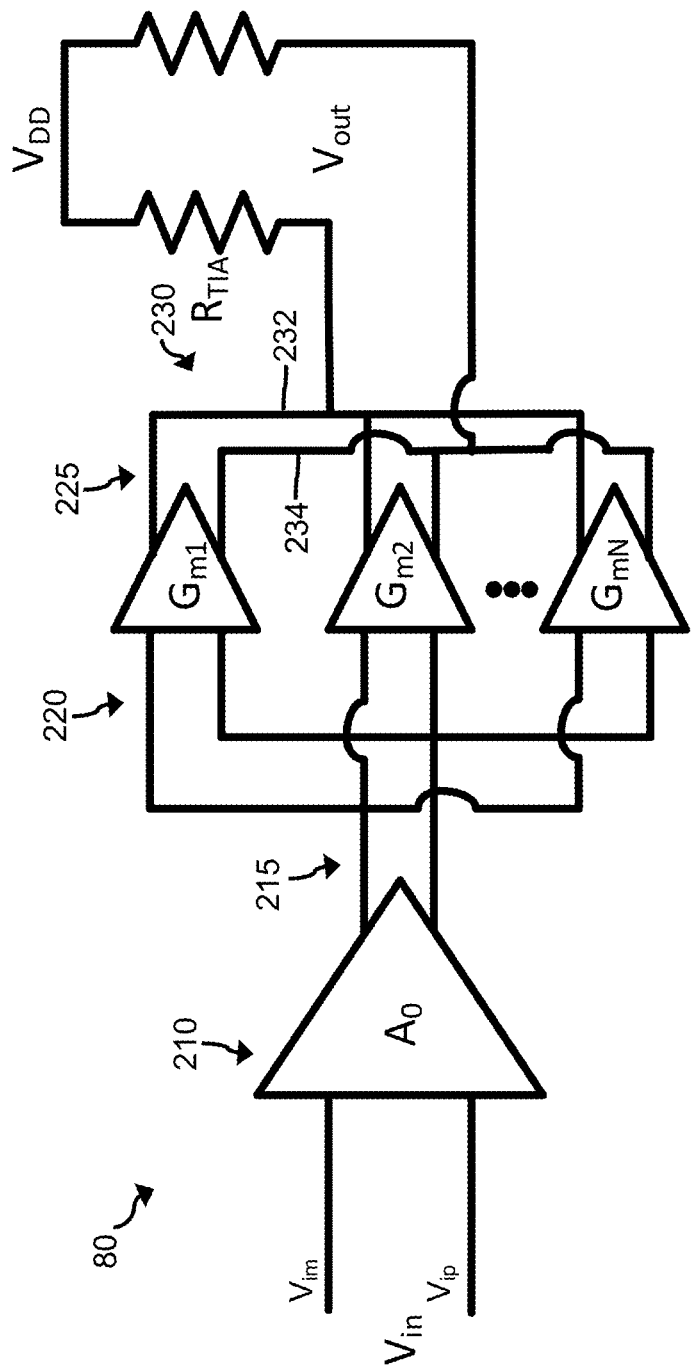
FIG. 8 is a circuit diagram of a PWL gain amplifier circuit according to an alternative embodiment.

FIG. 8 is a circuit diagram of a PWL gain amplifier circuit 80 according to an alternative embodiment. PWL gain amplifier circuit 80 is the same as PWL amplifier gain circuit 20 except that PWL gain amplifier circuit 80 does not include the attenuation circuit $B_0$ and the corresponding transconductor $G_{mN}$. Thus, PWL gain amplifier circuit 80 has one less transconductor $G_m$ (e.g., for a total of N−1 transconductors $G_m$) compared to PWL gain amplifier circuit 80 (e.g., which has a total of N transconductors $G_m$). Each transconductor $G_m$ has a different LIR. In some embodiments, the PWL gain amplifier circuit 80 can be configured such that the LIR of $G_{m1}$<LIR of $G_{m2}$ . . . <LIR of $G_{mN}$.

In some embodiments, the output of the PWL gain amplifier circuit 80 can include a transimpedance amplifier that is the same as transimpedance amplifier 700 in PWL gain amplifier circuit 70.

Figure 9:
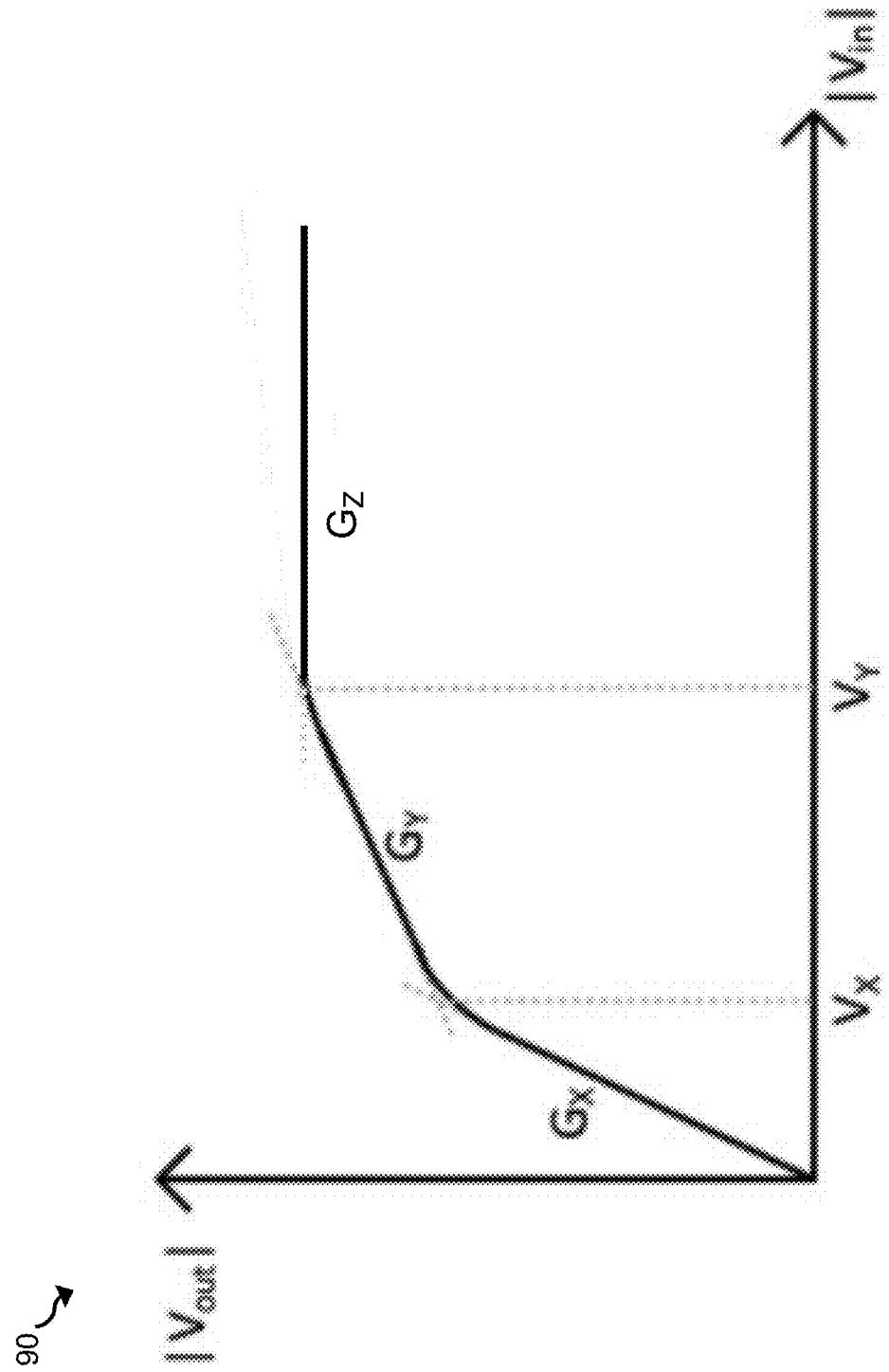
FIG. 9 is an example graph of a simplified 3-segment voltage transfer function that can be produced with the PWL gain amplifier circuit illustrated in FIG. 8.

FIG. 9 is an example graph 90 of a simplified 3-segment voltage transfer function that can be produced with PWL gain amplifier circuit 80 according to an embodiment. Graph 90 is the same as graph 10 except that region $G_Z$ has a gain of 0 (i.e., a slope of 1). Both graph 10, 90 illustrate the relationship $G_X > G_Y > G_Z$. Graph 90 can be produced when the PWL gain amplifier circuit 80 includes 2 transconductor (i.e., N=2). Graph 90 can be modified to include additional linear gain regions when N>2.

The graph 90 illustrates three linear gain regions labeled as $G_X$, $G_Y$, and $G_Z$. These regions ($G_X$, $G_Y$, and $G_Z$) are the incremental voltage gains between $|V_{in}|$ and $|V_{out}|$ for the PWL amplifier where $G_X > G_Y > G_Z$. When $|V_{in}| < V_X$, the amplifier exhibits a gain of $G_X$, followed by a gain of $G_Y$ for $V_X < |V_{in}| < V_Y$, and then a voltage gain of $G_Z$ for $|V_{in}| > V_Y$ (where $V_X < V_Y$). $V_X$ and $V_Y$ are the first and second transition voltages, respectively, in graph 90.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

Also, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

What is claimed is:

1. A piecewise linear (PWL) gain amplifier circuit comprising:
  a differential preamplifier electrically coupled to a differential input, the differential input having an input voltage across the differential input;
  an attenuation circuit electrically coupled to the differential input, the attenuation circuit in parallel electrically with the differential preamplifier; and
  a plurality of transconductors, each transconductor having a respective differential output that is electrically coupled to a common differential PWL output, wherein the plurality of transconductors comprises:
    a first transconductor having a differential input that is electrically coupled to a differential output of the differential preamplifier, the first transconductor having a first linear input range;
    a second transconductor having a differential input that is electrically coupled to the differential output of the differential preamplifier, the second transconductor having a second linear input range, the first and second transconductors in parallel electrically with each other; and
    a third transconductor having a differential input that is electrically coupled to a differential output of the attenuation circuit, the third transconductor having a third linear input range,
  wherein:
    the first linear input range is less than the second linear input range, and
    the second linear input range is less than the third linear input range.

2. The PWL gain amplifier circuit of claim 1, wherein each transconductor comprises a differential transconductor.

3. The PWL gain amplifier circuit of claim 2, wherein each differential transconductor comprises:

a first transistor having a gate terminal, a source terminal, and a drain terminal, the gate terminal of the first transistor electrically coupled to a first line of the differential output of the differential preamplifier;

a first degeneration resistor electrically coupled to the source terminal of the first transistor;

a second transistor having a gate terminal, a source terminal, and a drain terminal, the gate terminal of the second transistor electrically coupled to a second line of the differential output of the differential preamplifier; and a second degeneration resistor electrically coupled to the source terminal of the second transistor.

4. The PWL gain amplifier circuit of claim 3, wherein the first and second transistors of each differential transconductor comprise NMOS transistors.

5. The PWL gain amplifier circuit of claim 3, wherein for each differential transconductor:

the drain terminal of the first transistor is electrically coupled to a first line of the respective differential output of a respective transconductor, and the drain terminal of the second transistor is electrically coupled to a second line of the respective differential output of the respective transconductor.

6. The PWL gain amplifier circuit of claim 5, wherein:

a first load resistor is electrically coupled to a first line of the common differential PWL output, and a second load resistor is electrically coupled to a second line of the common differential PWL output.

7. The PWL gain amplifier circuit of claim 6, wherein the first and second lines of the common differential PWL output are electrically coupled to first and second input terminals, respectively, of an operational amplifier, the operational amplifier and the first and second load resistors forming a transimpedance amplifier.

8. The PWL gain amplifier circuit of claim 7, wherein:

the operational amplifier comprises first and second output terminals;

a first feedback line is electrically coupled to the first input terminal, the first output terminal, and the first load resistor; and a second feedback line electrically is coupled to the second input terminal, the second output terminal, and the second load resistor.

9. The PWL gain amplifier circuit of claim 1, wherein the differential preamplifier comprises:

a first preamplifier transistor having a gate terminal, a source terminal, and a drain terminal, the gate terminal of the first preamplifier transistor electrically coupled to a first line of the differential input;

a first preamplifier degeneration resistor electrically coupled to the source terminal of the first preamplifier transistor;

a second preamplifier transistor having a gate terminal, a source terminal, and a drain terminal, the gate terminal of the second preamplifier transistor electrically coupled to a second line of the differential input;

a second preamplifier degeneration resistor electrically coupled to the source terminal of the second preamplifier transistor;

a first preamplifier load resistor electrically coupled to the drain terminal of the first preamplifier transistor; and a second preamplifier load resistor electrically coupled to the drain terminal of the second preamplifier transistor.

10. The PWL gain amplifier circuit of claim 9, wherein the first and second preamplifier transistors comprise NMOS transistors.

11. The PWL gain amplifier circuit of claim 9, wherein each differential transconductor comprises:

a first transistor having a gate terminal, a source terminal, and a drain terminal, the gate terminal of the first transistor electrically coupled to a first line of the differential output of the differential preamplifier;

a first degeneration resistor electrically coupled to the source terminal of the first transistor;

a second transistor having a gate terminal, a source terminal, and a drain terminal, the gate terminal of the second transistor electrically coupled to a second line of the differential output of the differential preamplifier; and a second degeneration resistor electrically coupled to the source terminal of the second transistor.

12. The PWL gain amplifier circuit of claim 11, wherein:

a first transconductor bias current flows through the first or second degeneration resistor of the first differential transconductor, the first and second degeneration resistors of the first differential transconductor having a first degeneration resistance, a second transconductor bias current flows through the first or second degeneration resistor of the second differential transconductor, the first and second degeneration resistors of the second differential transconductor having a second degeneration resistance, and a preamplifier bias current flows through the first or second preamplifier degeneration resistor, the first and second degeneration resistors of the differential preamplifier having a preamplifier degeneration resistance.

13. The PWL gain amplifier circuit of claim 12, wherein the preamplifier bias current ($I_{PRE}$), the first transconductor bias current ($I_{B1}$), the second transconductor bias current ($I_{B2}$), the preamplifier degeneration resistance ($R_{PRE}$), the first degeneration resistance ($R_{S1}$), and the second degeneration resistance ($R_{S2}$), have the following relationship:

$$I_{B1} \times R_{S1} < I_{B2} \times R_{S2} < \frac{I_{PRE} \times R_{PRE}}{G_{PRE}}$$

where $G_{PRE}$ is a gain of the differential preamplifier.

14. The PWL gain amplifier circuit of claim 12, wherein:

a first load resistor is electrically coupled to a first line of the common differential PWL output, a second load resistor is electrically coupled to a second line of the common differential PWL output, the first and second load resistors have a load resistance ($R_{TIA}$), a first transition voltage ($V_{OX}$) corresponds to an outer limit of the first linear input range of the first transconductor, a second transition voltage ($V_{OY}$) corresponds to an outer limit of the second linear input range of the second transconductor, and the first transition voltage ($V_{OX}$), the second transition voltage ($V_{OY}$), the first transconductor bias current ($I_{B1}$), the second transconductor bias current ($I_{B2}$), and the load resistance ($R_{TIA}$) have the following relationship:

$|V_{OX}|=2I_{B1} \times R_{TIA}$, and $|V_{OY}|=2I_{B2} \times R_{TIA}$.

15. The PWL gain amplifier circuit of claim 12, wherein: the first and second transconductor bias currents ($I_{B1}$, $I_{B2}$) are proportional to $1/R_{TIA}$, such that the first and second transition voltages ($V_{OX}$, $V_{OY}$) are substantially constant over a variation in a semiconductor manufacturing process, a temperature of the PWL gain amplifier circuit, and/or a supply voltage at the common differential PWL output.

16. The PWL gain amplifier circuit of claim 1, wherein:
when an absolute value of the input voltage is less than a first transition voltage, the differential preamplifier and each transconductor contribute to a voltage gain of the input voltage, and
the first transition voltage corresponds to an outer limit of the first linear input range of the first transconductor.

17. The PWL gain amplifier circuit of claim 16, wherein:
when the absolute value of the input voltage is between the first transition voltage and a second transition voltage, only the differential preamplifier and the second and third transconductors contribute to the voltage gain of the input voltage,
the second transition voltage is higher than the first transition voltage, and
the second transition voltage corresponds to an outer limit of the second linear input range of the second transconductor.

18. The PWL gain amplifier circuit of claim 17, wherein:
when the absolute value of the input voltage is greater than the second transition voltage, only the differential preamplifier and the third transconductor contribute to the voltage gain of the input voltage.

* * * * *